United States Patent [19]
Duane et al.

[11] Patent Number: 5,885,761
[45] Date of Patent: Mar. 23, 1999

[54] SEMICONDUCTOR DEVICE HAVING AN ELEVATED ACTIVE REGION FORMED FROM A THICK POLYSILICON LAYER AND METHOD OF MANUFACTURE THEREOF

[75] Inventors: Michael Duane; Daniel Kadosh, both of Austin; Mark I. Gardner, Cedar Creek, all of Tex.

[73] Assignee: Advanced Micro Devices, Austin, Tex.

[21] Appl. No.: 780,705

[22] Filed: Jan. 8, 1997

[51] Int. Cl.⁶ ............ H01L 21/22; H01L 21/38; H01L 21/4763; H01L 21/336
[52] U.S. Cl. ............ 438/564; 438/626; 438/692; 438/301
[58] Field of Search ........... 438/301, 302, 438/303, 304, 305, 306, 307, 564, 558, 626, 634, 645, 691, 692, 693

[56] References Cited

U.S. PATENT DOCUMENTS

| | | |
|---|---|---|
| 5,124,276 | 6/1992 | Samata et al. . |
| 5,198,378 | 3/1993 | Rodder et al. . |
| 5,270,234 | 12/1993 | Huang et al. . |
| 5,371,026 | 12/1994 | Hayden et al. . |
| 5,376,578 | 12/1994 | Hsu et al. ............... 437/56 |
| 5,597,746 | 1/1997 | Prall . |
| 5,677,573 | 10/1997 | Prall et al. ............... 257/750 |

OTHER PUBLICATIONS

S. Wolf, *Silicon Processing for the VLSI Era*, vol. 2: Processing Integration, pp. 154–169, copyright 1990.

*Primary Examiner*—Brian Dutton
*Attorney, Agent, or Firm*—Merchant, Gould, Smith, Edell, Welter & Schmidt, P.A.

[57] ABSTRACT

A semiconductor device and process for manufacture thereof is disclosed in which an elevated, active polysilicon region is formed by forming a gate electrode/nitride layer structure on a surface of a semiconductor substrate with spacers formed on adjacent walls to define an active region of the substrate. A thick polysilicon layer is formed over the resultant structure and then planarized leaving a portion of the polysilicon layer above the active region of the substrate. The remaining portion is doped to form an elevated active region.

14 Claims, 5 Drawing Sheets

SEMICONDUCTOR DEVICE HAVING AN ELEVATED ACTIVE REGION FORMED FROM A THICK POLYSILICON LAYER AND METHOD OF MANUFACTURE THEREOF

FIELD OF THE INVENTION

The present invention is directed generally to a semiconductor device and a method of manufacture thereof and, more particularly, to such a device having an elevated active region.

BACKGROUND OF THE INVENTION

Over the last several decades, the electronics industry has undergone a revolution by the use of semiconductor technology to fabricate small, highly integrated electronic devices. The most common and important semiconductor technology presently used is silicon-based. A large variety of semiconductor devices have been manufactured having various applications in numerous disciplines. One such silicon-based semiconductor device is a metal-oxide-semiconductor (MOS) transistor.

The principal elements of a typical MOS semiconductor device are illustrated in FIG. 1. The device generally includes a semiconductor substrate 101 on which a gate electrode 103 is disposed. The gate electrode 103 acts as a conductor. An input signal is typically applied to the gate electrode 103 via a gate terminal (not shown). Heavily doped source/drain regions 105 are formed in the semiconductor substrate 101 and are connected to source/drain terminals (not shown). As illustrated in FIG. 1, the typical MOS transistor is symmetrical, which means that the source and drain are interchangeable. Whether a region acts as a source or drain depends on the respective applied voltages and the type of device being made (e.g., PMOS, NMOS, etc.). Thus, as used herein, the term source/drain region refers generally to an active region used for the formation of a source or drain.

A channel region 107 is formed in the semiconductor substrate 101 beneath the gate electrode 103 and separates the source/drain regions 105. The channel is typically lightly doped with a dopant of a type opposite to that of the source/drain regions 105. The gate electrode 103 is generally separated from the semiconductor substrate 101 by an insulating layer 109, typically an oxide layer such as $SiO_2$. The insulating layer 109 is provided to prevent current from flowing between the gate electrode 103 and the source/drain regions 105 or channel region 107.

In operation, an output voltage is typically developed between the source and drain terminals. When an input voltage is applied to the gate electrode 103, a transverse electric field is set up in the channel region 107. By varying the transverse electric field, it is possible to modulate the conductance of the channel region 107 between the source region and the drain region. In this manner, an electric field controls the current flow through the channel region 107. This type of device is commonly referred to as a MOS field-effect-transistor (MOSFET).

Semiconductor devices, like the one described above, are used in large numbers to construct most modern electronic devices. As a larger number of such devices are integrated into a single silicon wafer, improved performance and capabilities of electronic devices can be achieved. In order to increase the number of semiconductor devices which may be formed on a given surface area of a substrate, the semiconductor devices must be scaled down (i.e., made smaller). This is accomplished by reducing the lateral dimensions of the device structure. As the dimensions of the device structure are reduced laterally, it also becomes necessary to scale down the vertical dimensions of the device.

The source/drain junction is an important vertical dimension which must be scaled down as the device structure is made smaller. For a MOS device having a channel length of less than 0.8 $\mu$m, for example, the source/drain junction depths must be scaled down to less than 250 nm in order to maintain adequate device performance. A decrease in junction depths, however, limits the ability to subject the junction to silicidation since, if the junction is too shallow, the entire junction can be consumed during the silicidation process.

A number of different approaches have been proposed for forming shallow junctions in silicon. In one approach, it has been proposed to perform the implantation of the source/drain dopant after the silicide layer has been formed with diffusion of the dopant through the silicide into the substrate. Another proposed solution uses selective epitaxial growth of silicon over the source/drain regions of the device being formed. These approaches add to the expense and/or manufacturing time of the devices. A more detailed description of such processes may be found in S. Wolf, *Silicon Processing for the VLSI Era*, Vol. 2: Processing Integration, pp. 154–169.

SUMMARY OF THE INVENTION

Generally, the present invention relates to a semiconductor device having an elevated active region and a method of fabrication thereof. In accordance with one embodiment of the invention, a fabrication process for a semiconductor device includes: forming a gate electrode on the semiconductor substrate; forming a nitride layer on the surface of the gate electrode; forming a sidewall spacer on the sidewalls of the gate electrode and the nitride layer; forming a thick polysilicon layer over the resultant structure; planarizing the polysilicon layer above the active region of the substrate; and doping the planarized polysilicon layer to form a polysilicon active layer above the active region of the substrate. In accordance with one aspect of the invention, a shallow active region is formed in the substrate by implanting dopants into the substrate prior to forming the thick polysilicon layer. In an alternative embodiment, a shallow active region is formed by doping the planarized polysilicon layer to form the elevated active region in such a manner that sufficient dopants diffuse into the substrate to form a desired shallow junction.

In accordance with one particular embodiment of the invention, the nitride layer formed on the gate electrodes is used as a stop layer for the planarization of the polysilicon layer. Removal of the nitride allows formation of a silicide on the gate electrodes and elevated active region without consuming the shallow active junction in the substrate.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
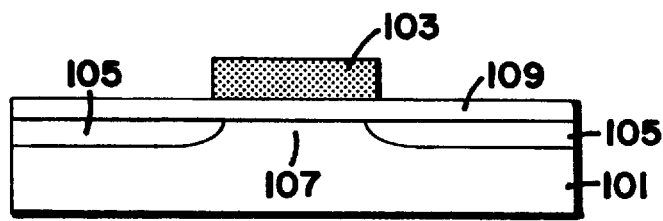
FIG. 1 illustrates one typical MOS semiconductor device structure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

The present invention is believed to be applicable to a number of semiconductor devices which employ shallow active regions as they are vertically scaled down. The present invention is particularly suited to MOS structures where it is desirable to form shallow source/drain junctions. While the present invention is not so limited, an appreciation of various aspects of the invention will be gained through a discussion of the fabrication process and characteristics of such a device in connection with the examples provided below.

Figure 2A:
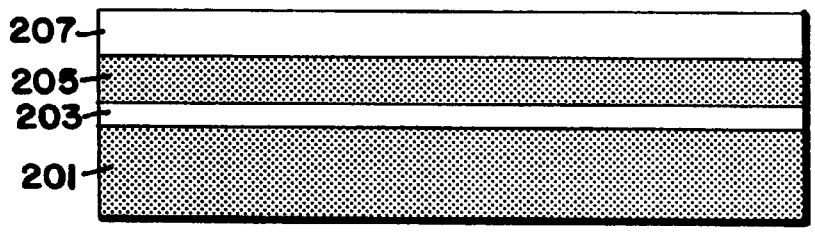
FIGS. 2A–2E illustrate a fabrication process in accordance with one embodiment of the invention.
Figure 2B:
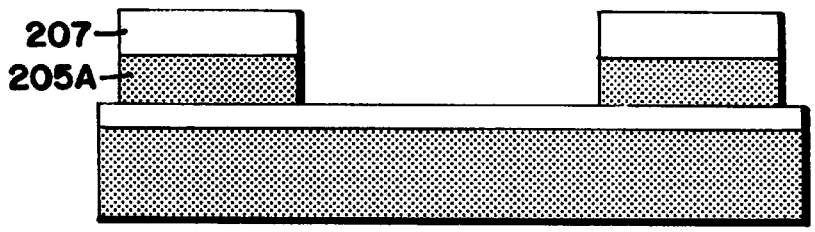

FIGS. 2A–2E illustrate a process for fabricating a semiconductor device having an elevated active region. Using known techniques, an oxide layer 203 is formed on a substrate 201. A gate electrode layer 205 is formed on the oxide layer 203. A nitride layer 207 is formed on the gate electrode layer 205. The resultant structure is illustrated in FIG. 2A. Using standard techniques, the structure is etched to form a plurality of gate electrodes 205A, each having a nitride layer 207A disposed on its upper surface as illustrated in FIG. 2B. It will be appreciated that a number of different known fabrication techniques could be used to obtain the gate electrode/nitride layer structure depicted as FIG. 2B.

Figure 2C:
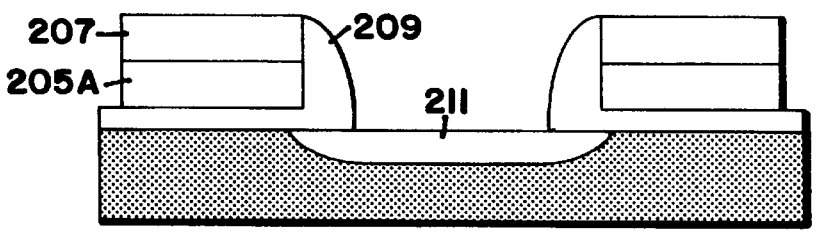

A portion of the semiconductor substrate 201 which lies between two adjacent gate electrodes 205 defines a region of the substrate 201 where an active region will be formed. Spacers 209 are formed on sidewalls of the gate electrode 205 and nitride layer 207 using conventional deposition and etching techniques. As will be better appreciated from the description below, the thickness of the nitride layer 207 is selected in consideration of the desired height and thickness of the spacers 209. Using the spacers 209 for alignment, dopants are implanted into the exposed portions of the substrate to form a shallow active region 211 in the substrate 201. The resultant structure is illustrated in FIG. 2C. The active region 211 may serve, for example, as a source/drain region of a semiconductor device.

Figure 2D:
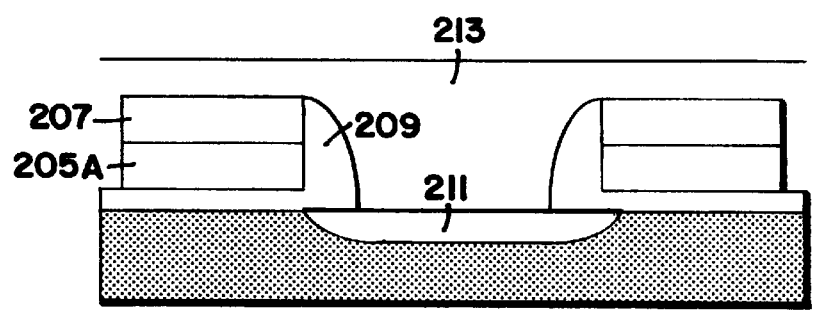

A relatively thick layer of polysilicon 213 is formed over the resultant structure and fills the space between the spacers 209 as illustrated in FIG. 2D. In this manner, the polysilicon layer 213 is formed on the surface of the substrate 201 above the active region 211 of the substrate 201. As noted above, the nitride layer 207 is formed relatively thick to increase the thickness of the spacers between the gate electrodes 205 and the polysilicon layer 213. As will be better appreciated from the description provided below, the spacers 209 insulate the gate electrodes 205A from an elevated active region formed from a portion of the polysilicon layer 213. The spacers 209 may be formed of an oxide or other suitable medium.

Figure 2E:
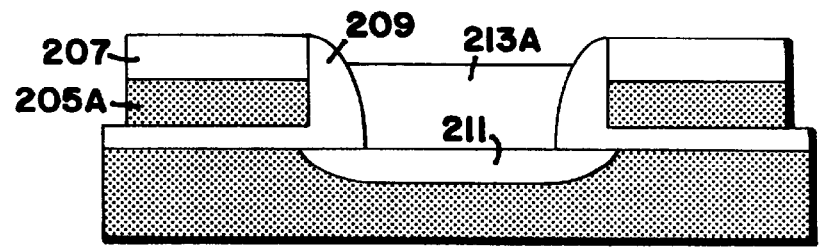

The polysilicon layer 213 is planarized leaving a portion of the polysilicon layer 213 between the spacers 209. The polysilicon layer may be planarized using a standard chemical mechanical polishing (CMP) process. Alternatively, conventional etching or other suitable processes can be used to planarize the polysilicon layer 213. The nitride layers 207A may be used as a stop layer for the planarization process. After the polysilicon layer 213 is planarized, a dopant is implanted into the remaining portion of the polysilicon 213 to form an elevated, high-conductance active region 213A as illustrated in FIG. 2E. The elevated active region 213A is disposed over the shallow active region 211, and effectively elevates the overall active region of the device.

Using the structure illustrated in FIG. 2E, a shallow source/drain junction may be formed having an elevated source/drain portion which facilitates subsequent processing of the device. For example, the upper surfaces of the gate electrodes 205A and the elevated active region 213A may have silicide layers formed thereon by removing the nitride layers 207A. The silicide layers may then be used for connection to other elements on the chip.

In the above embodiment, the shallow active region 211 is formed by implanting one or more dopants into the substrate prior to formation of the thick polysilicon layer 213. In an alternative embodiment of the invention, the shallow active region and the elevated active region may be formed in a single implantation process. An example of one particular embodiment of a single implantation process will be described with reference to FIGS. 3A–3D.

Figure 3A:
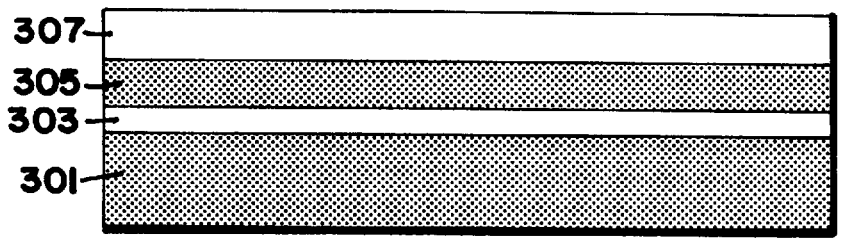
FIGS. 3A–3D illustrate another fabrication process in accordance with another embodiment of the invention.
Figure 3B:
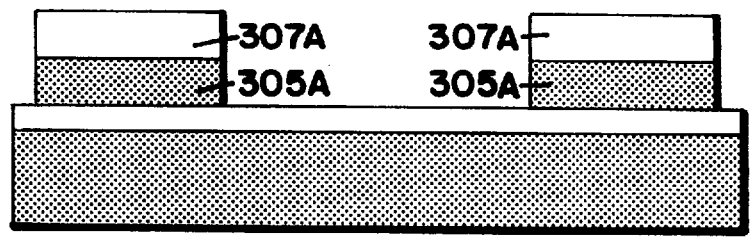

On a substrate 301, an oxide layer 303, polysilicon gate electrode layer 305 and a nitride layer 307 are successively formed using standard techniques. As noted above, the thickness of the nitride layer 307 is selected in consideration of the desired spacer characteristics. The resultant structure is illustrated in FIG. 3A. The nitride layer 307 and the polysilicon gate electrode layer 305 are patterned and etched using conventional techniques to form a plurality of gate electrodes 305A having portions 307A of the nitride layer 307A on the surfaces thereof as illustrated in FIG. 3B. Adjacent walls of the gate electrodes 305A define regions of the substrate where active regions will be formed.

Figure 3C:
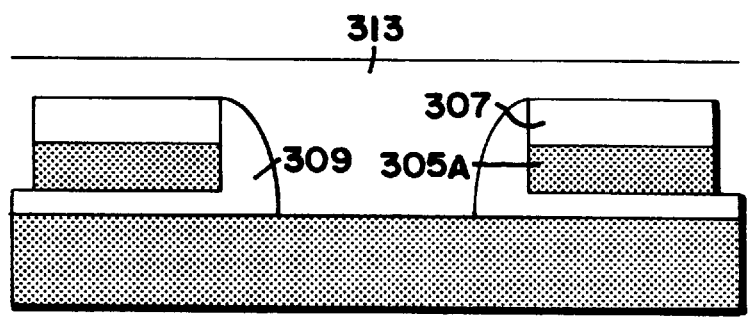

Using standard techniques, spacers 309 are then formed on adjacent walls of the gate electrode 305A and nitride layer portion 307A structures. A relatively thick layer of polysilicon 313 is then deposited over the exposed portions of the substrate and over the gate electrode 305A and nitride layer portion 307A structures. The resultant structure is illustrated in FIG. 3C. Using a CMP, dry etch or other suitable process, the polysilicon layer 313 is planarized leaving a portion of the polysilicon layer 313 between the spacers 309.

Figure 3D:
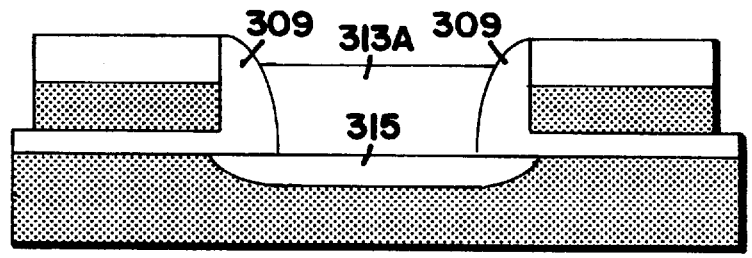

The remaining portion of the polysilicon silicon layer 313 is implanted with a dopant to form an elevated active polysilicon region 313A. The dopants used to dope elevated active region 313A diffuse rapidly through the polysilicon and into the substrate 301. The energies and dopant dosages used to dope the elevated active region are selected to provide sufficient diffusion into the substrate 301 to form a shallow active region 315 in the substrate 301. The resultant structure is illustrated in FIG. 3D. Using this process, a single implantation step may be used to form a shallow source/drain junction, for example, and an elevated active source/drain region.

In a manner similar to that described in connection with FIG. 2E, the nitride layers 307A may be removed and silicide layers may be formed on upper surface of the elevated active region 313A and gate electrodes 305A.

Figure 4:
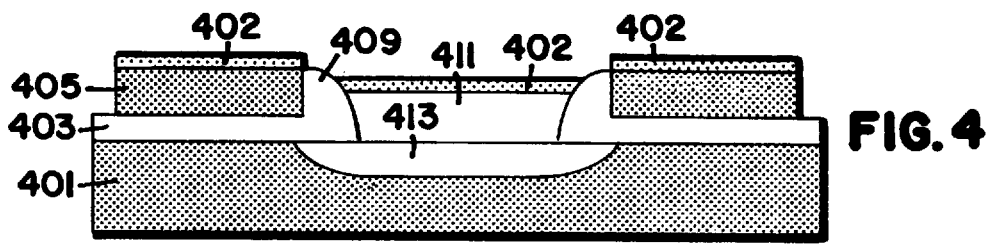
FIG. 4 illustrates a semiconductor device manufactured in accordance with an aspect of the present invention.

FIG. 4 illustrates an exemplary MOS structure which may be fabricated using various aspects of the invention described above. Silicide layers 402 are formed on the surfaces of gate electrodes 405 and an elevated source/drain region 411. A shallow source/drain region 413 is provided within the substrate 401. The elevated source/drain region 411 is insulated from the gate electrode by the spacers 409. This structure provides improved performance and integration by allowing the vertical dimensions of the source/drain junctions to be reduced while facilitating silicidation of the effective source/drain.

Figure 5A:
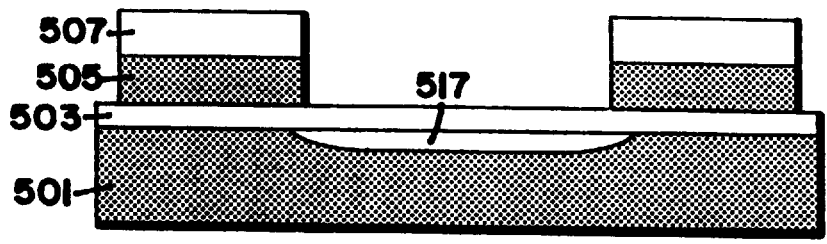
FIG. 5A–5D illustrates still another fabrication process in accordance with another embodiment of the invention.
Figure 5B:
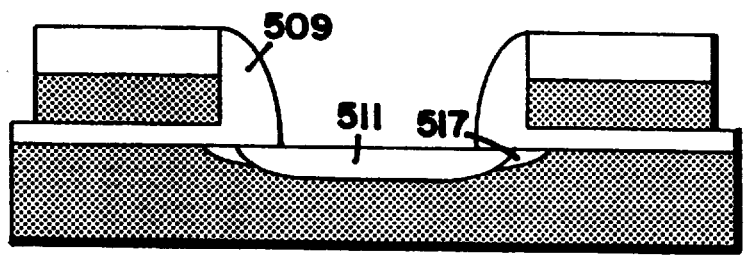
Figure 5C:
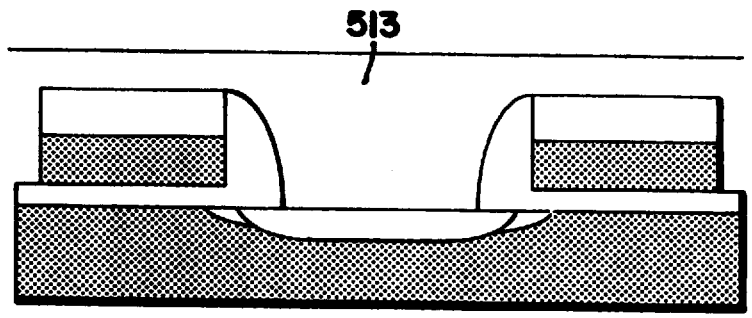
Figure 5D:
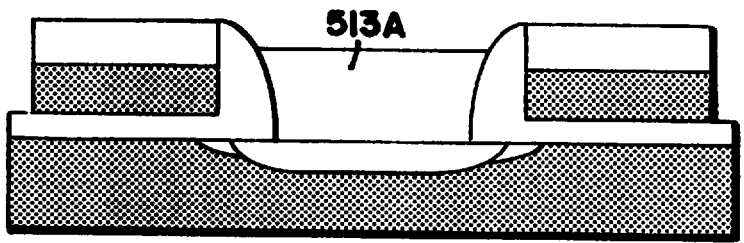

It will be appreciated that the above described process may be used to form a number of different semiconductor devices. FIGS. 5A–5D illustrate, for example, a fabrication process similar to that of FIGS. 2A–2E, in which a lightly-doped-drain (LDD) structure is fabricated. As illustrated in FIG. 5A, the gate electrode 505 and nitride layer 507 stacked structures disposed on a gate oxide layer 503 may be used to align an LDD implantation process to form an LDD region 517 in the substrate 501. Spacers 509 are then formed using conventional techniques and a conventional source/drain implant is carried out to form a source/drain region 511 as illustrated in FIG. 5B. As depicted in FIGS. 5C–5D, an elevated active region 513A is formed from a thick polysilicon layer 513 using various fabrication process steps described above. The resultant structure is an LDD semiconductor device having elevated active region. As will be appreciated, the additional fabrication steps associated with forming a LDD region could be used with any of the various alternatives described above.

As noted above, the present invention is applicable to the fabrication of a number of different devices where elevated active regions may be used to facilitate fabrication of a vertically scaled down device. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A process of forming a semiconductor device, the process comprising:

forming a gate electrode on a substrate;

forming a nitride layer on a surface of the gate electrode;

forming a spacer on sidewalls of the gate electrode and the nitride layer adjacent to an active region of the substrate to form a resultant structure;

forming a polysilicon layer over the resultant structure;

planarizing the polysilicon layer leaving a remaining portion of the polysilicon layer disposed on the active region of the substrate;

doping the remaining portion of the polysilicon layer to form an elevated active layer above the active region of the substrate;

removing the nitride layer; and forming a silicide layer on surfaces of the gate electrode and the elevated active layer.

2. A process as recited in claim 1, wherein forming the nitride layer includes forming the nitride layer to a thickness based on a thickness of the spacer.

3. A process as recited in claim 1, further comprising implanting dopants into the active region of the substrate prior to forming the polysilicon layer.

4. A process as recited in claim 1, wherein the doping of the remaining portion of the polysilicon layer includes diffusing a dopant into the substrate to form an active region in the substrate.

5. A process as recited in claim 1, wherein the planarizing of the polysilicon layer includes a chemical mechanical polishing (CMP) process using the nitride layer as a stop layer for the CMP process.

6. A process as recited in claim 1, wherein the planarizing of the polysilicon layer includes etching the polysilicon layer using the nitride layer as a stop layer for the etching.

7. A process as recited in claim 1, further comprising implanting a first dopant into the active region of the substrate prior to forming the spacer.

8. A process as recited in claim 7, further comprising implanting a second dopant into the active region of the substrate after forming the spacer and prior to forming the polysilicon layer.

9. A process as recited in claim 7, wherein the doping of the remaining portion of the polysilicon layer includes diffusing a dopant from the remaining portion of the polysilicon layer into the substrate to form an active region in the substrate.

10. A process as recited in claim 1, wherein forming the silicide layer includes forming a first silicide layer on the gate electrode and forming a second silicide layer on the elevated active layer, separated from the first silicide layer by the spacer.

11. A process of forming a semiconductor device, the process comprising:

forming a gate oxide layer on a surface of a semiconductor substrate;

forming a gate electrode layer on the gate oxide layer;

forming a nitride layer on a surface of the gate electrode layer;

etching the gate electrode layer and the nitride layer to form a plurality of gate electrode and nitride layer stacked structures, an active region of the substrate being defined by adjacent walls of the gate electrode and nitride layer stacked structures;

forming spacers on the adjacent walls of the gate electrode and nitride layer structures;

forming a polysilicon layer over the substrate after forming the spacers planarizing the polysilicon layer using the nitride layers as an etch stop layer leaving a portion of the polysilicon layer disposed on the active region of the substrate between the spacers;

doping the portion of the polysilicon layer disposed on the active region of the substrate to form an elevated active layer above the active region of the substrate; and forming a silicide layer on a surface of the elevated active region.

12. The process as recited in claim 11, wherein forming the nitride layer includes forming the nitride layer to a thickness based on a thickness of the spacers.

13. A process as recited in claim 11, further including removing the nitride layer and forming silicide layers on surfaces of the gate electrode layer, the silicide layer on the elevated active region being separated from the silicide layers on the gate electrode layer by the spacers.

14. A process of forming a semiconductor device, comprising: depositing a gate electrode layer over a substrate;

depositing a nitride layer on a surface of the gate electrode layer;

removing portions of the gate electrode layer and the nitride layer to form at least two gate electrode and nitride layer stacked structures and to define an active region of the substrate between adjacent walls of the two gate electrode and nitride layer stacked structures;

forming spacers on the adjacent walls of the two gate electrode and the nitride layer stacked structures;

depositing a polysilicon layer over the substrate after forming the spacers;

polishing the polysilicon layer to remove the polysilicon layer from over the two gate electrode and nitride layer stacked structures and leave a remaining portion of the polysilicon layer disposed on the active region of the substrate between the spacers;

doping the remaining portion of the polysilicon layer to form an elevated active layer above the active region of the substrate;

removing the nitride layer; and forming a first silicide layer on a surface of the elevated active region and second silicide layers on surfaces of the gate electrode layer, the second silicide layers being separated from the first silicide layer by the spacers.

* * * * *